USOO5608331A

United States Patent [19]
Newberg et al.

[11] Patent Number: 5,608,331
[45] Date of Patent: Mar. 4, 1997

[54] NOISE MEASUREMENT TEST SYSTEM

[75] Inventors: Irwin L. Newberg, Northridge; Gene A. Wagner, Torrance; Gene Rzyski, Cypress; Richard A. Stevens, West Hills, all of Calif.

[73] Assignee: Hughes Electronics, Los Angeles, Calif.

[21] Appl. No.: 471,812

[22] Filed: Jun. 6, 1995

[51] Int. Cl.[6] .................................................. G01R 27/26
[52] U.S. Cl. ....................... 324/613; 324/76.71; 455/67.3
[58] Field of Search ............................ 324/76.54, 76.71, 324/613; 455/67.3, 226.1

[56]   References Cited

U.S. PATENT DOCUMENTS

| 4,144,491 | 3/1979 | Hutcheon | 324/76.54 |
|---|---|---|---|
| 4,918,373 | 4/1990 | Newberg | 324/613 |
| 5,263,185 | 11/1993 | Bush | 324/613 |

FOREIGN PATENT DOCUMENTS

| 405087855 | 4/1993 | Japan | 324/613 |
|---|---|---|---|
| 864137 | 9/1981 | U.S.S.R. | 324/76.71 |
| 0875292 | 10/1981 | U.S.S.R. | 324/76.71 |
| 1352398 | 11/1989 | U.S.S.R. | 324/76.71 |
| 001769247 | 1/1992 | U.S.S.R. | 324/613 |

*Primary Examiner*—Maura K. Regan
*Attorney, Agent, or Firm*—Leonard A. Alkov; Wanda K. Denson-Low

[57]   ABSTRACT

A noise measurement test system 10' for making phase noise and amplitude noise measurements of microwave signals derived from a continuous wave RF source. The system 10' comprises an RF input for receiving an applied RF noise signal and an RF coupler 11 coupled to the RF input for splitting the applied RF noise signal into first and second paths 18a, 18b. A mixer 15 that comprises a synchronous phase detector 15 is coupled to receive signals from the first and second paths 18a, 18b, respectively, and which outputs demodulated phase noise. The first path 18a comprises a variable attenuator 14 and a variable phase shifter 13 coupled between the coupler 11 and the first input of the mixer 15 for providing a reference signal input to the synchronous detector 15. The second path 18b comprises a delay line and an adjustable RF carrier nulling circuit 30 coupled between the coupler 11 and the mixer 15. A video amplifier is coupled to an output of the mixer 15 for providing a baseband video output signal from the system 10' that is processed to produce noise data.

12 Claims, 3 Drawing Sheets

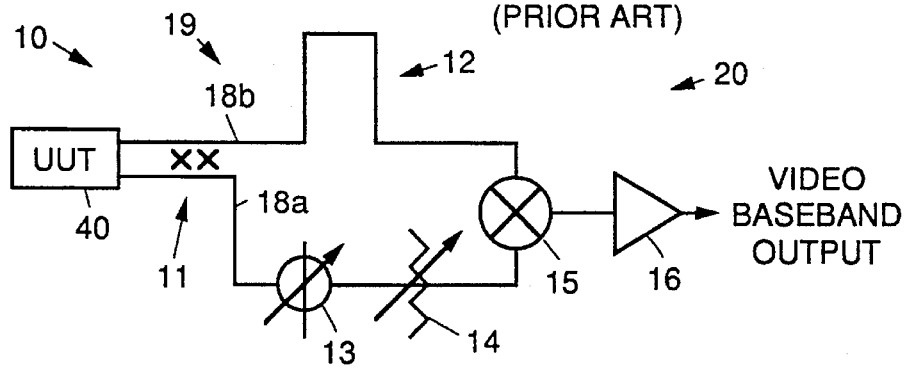
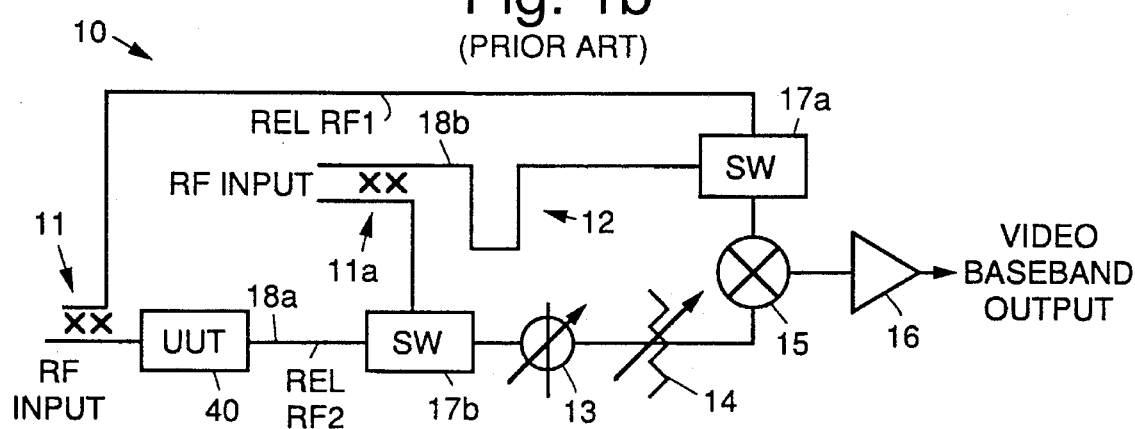
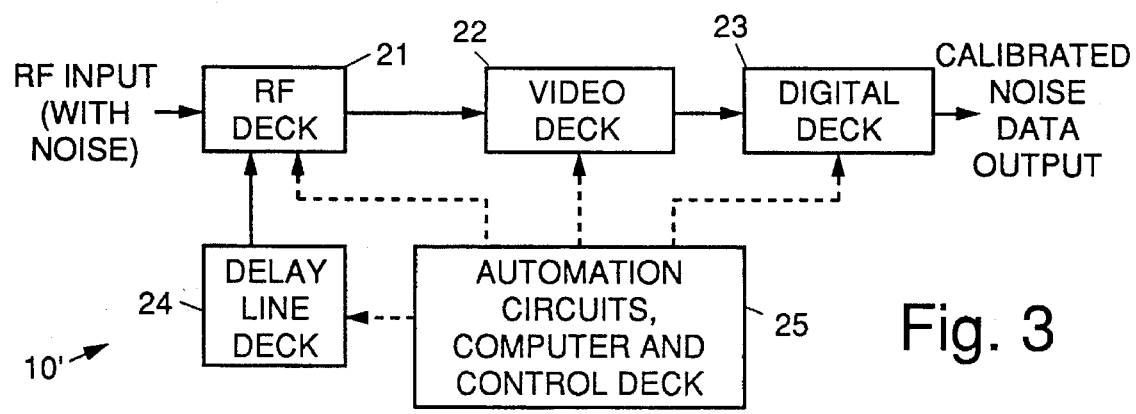

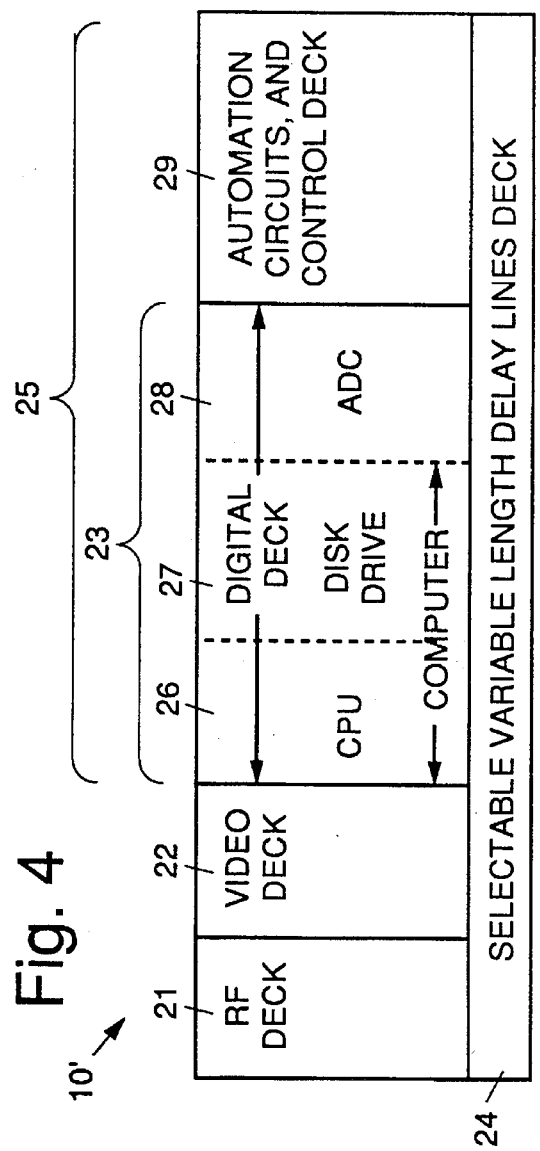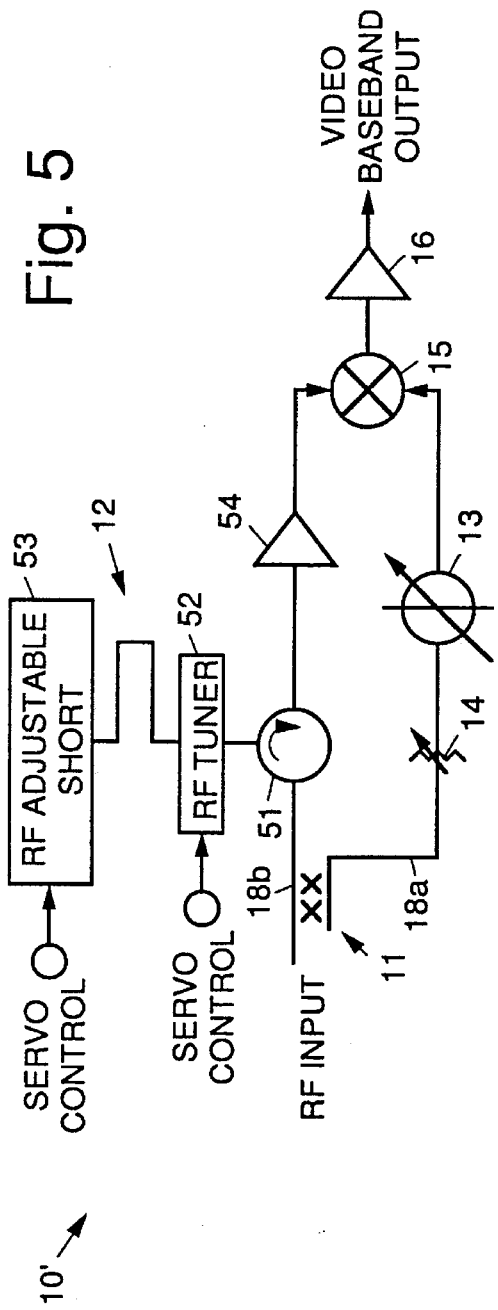

NOISE MEASUREMENT TEST SYSTEM

BACKGROUND

The present invention relates generally to microwave test equipment, and more particularly, to an automated noise measurement test system for making phase noise and amplitude noise measurements of microwave signals using waveguide, coax and fiber optic delay lines discriminators.

Two conventional approaches for making phase noise measurements are primarily employed by the RF community. The first is a noise measurement test system that uses a waveguide delay line discriminator, and the second uses a test system that measures the combined noise from two phase-locked RF sources; one source is a low noise reference oscillator and the other source is the (oscillator) unit under test (UUT). There are also several less common types of test systems, including cavity-discriminator and three-oscillator mixing. These conventional test systems do not have the combined sensitivity capability and flexibility in a rugged, compact, and/or affordable unit to measure new, low phase noise microwave sources that are currently under development and current low noise sources. In addition, the conventional test systems are generally relatively large, costly and inflexible.

It has been found that, by modifying the currently used waveguide-based noise measurement test system, it is possible to provide a test system with performance that exceeds the capability of commercially available systems and currently used military waveguide-based noise measurement systems. The two oscillator mixing approach requires one ultra-low noise source to evaluate low noise sources and this can result in considerable additional expense since the second ultra-low noise oscillator must be provided. The major disadvantage of the current waveguide-based test system is its large size, weight, inflexibility and comparative cost. Also, no currently available systems are fully automated, which means that a skilled operator and appreciable setup time is required to use the systems.

Several techniques employed in the present invention, referred to as an automated noise measurement test system, are generally described in articles, and a patent for a fiber optic phase noise test set, U.S. Pat. No. 4,918,373 assigned to an assignee of the present invention. The articles include "New Discriminator Boosts Phase-Noise Testing", in Microwaves, March 1982, "Extending the Range and Accuracy of Phase Noise Measurements", 42nd Annual Frequency Control Symposium, 1988, "The Measurement of Noise in Microwave Transmitters", IEEE Transactions on Microwave Theory & Techniques, Vol. MTT-25 No. 4, April 1977, "Cross-Correlation Phase Noise Measurements", 1992 IEEE Frequency Control Symposium, and "Using Digital Data Processing to Speed Up Radar Phase Noise Measurements", Autotestcon, September 1994, pp. 205–210. However, while the present invention has applied some of the techniques disclosed in these different publications, the techniques have been refined and incorporated into a modular, flexible, compact and affordable test system that is not disclosed in the references.

Accordingly, it is an objective of the present invention to provide for a noise measurement test system for making phase noise and amplitude noise measurements of microwave signals that overcomes the limitations of conventional systems.

SUMMARY OF THE INVENTION

To meet the above and other objectives, the present invention is an automated noise measurement test system (also known as a Universal Noise Integrated Tester or UNIT) for making phase noise and amplitude noise measurements of microwave signals using waveguide, coax and fiber optic delay lines in a discriminator type of phase noise test set. The delay line discriminator noise measurement test system uses the RF input from the unit under test (UUT) to generate a reference signal via the delay line, for phase noise evaluation.

The system includes an RF input for receiving an applied RF noise signal and an RF coupler coupled to the RF input for splitting the applied RF noise signal into first and second paths. A mixer comprising a synchronous phase detector is coupled to receive signals from the first and second paths, respectively, and which outputs demodulated phase noise. The first path includes a variable attenuator and a variable phase shifter coupled between the coupler and the first input of the mixer for providing one signal input to the synchronous detector. The second path comprises a delay line and an adjustable RF carrier nulling circuit coupled between the coupler and the mixer to provide a reference signal to the mixer. A video amplifier is coupled to an output of the mixer for providing a baseband video output signal from the system.

Both absolute and relative phase noise (frequency modulation, FM) measurements can be made with the noise measurement test system. Absolute noise measurements are made where the RF signal to be measured comes from a unit where the RF signal is generated and thus them is no RF input signal (i.e., RF phase locked loops, multiplier chains, and other types of RF oscillators) is available. In the delay line discriminator the reference signal is obtained by delaying the RF input signal. The delayed signal is then compared in a phase detector with the non-delayed RF input signal. Relative noise measurements are made when the RF signal from a unit to be measured can be obtained before and after noise is added to the signal. This is the case with RF amplifiers. The reference signal is the input to the unit under test and the output signal that has the added noise after the input RF goes through the unit under test, is compared to the reference input using the same type of mixer phase detector as was used in the absolute case.

In the above systems, both pulsed and continuous wave (CW) RF signals may be measured. Also amplitude modulated (AM) noise may be measured in both systems without using any delay using a simple RF detector or by setting up the mixer (used in both systems) as an amplitude detector. A mixer may be used as either a phase or amplitude detector when both RF inputs are at the same frequency and are caused to be in phase (amplitude detector) or 90° out of phase (phase detector). The phase and amplitude of the signal applied to one arm of the mixer can be adjusted using the variable phase shifter for the in phase or 90° condition and attenuator for controlling the signal amplitude into the mixer to obtain optimum mixer performance.

To make phase or amplitude noise measurements, the noise measurement test system needs to have a calibration signal with known levels of phase or amplitude noise. The noise signal from the noise measurement test system is compared with the calibration signal to determined the level of the phase or amplitude noise. This comparison is done relative to the RF carrier level that contains the noise signal. The output is given in dB relative to the carrier level in a given bandwidth (usually 1 Hz). The calibration signal can be generated by creating RF signal sidebands or as a simulated sideband injected as a video or digital signal.

The present system provides a universal capability in an automated system that performs both absolute and relative noise measurements, measures noise over a large RF carrier spectrum from below 1 GHz to above 100 GHz. The present system has a large RF carrier relative (offset) frequency noise measurement range from less than 1 Hz to more than a Gigahertz. The present system accommodates both pulsed and continuous-wave RF signals and provides either a simple baseband or more complex RF sideband calibration signal generation technique. The present noise test system is flexible in operation, computer controlled and digitally processed, and has a parameter selection and range that do not currently exist in any noise test system.

The present system uses coax and fiber optic delay lines that allow RF noise measurement over many octaves of carrier signal bandwidth and relative noise that is close to and far from the RF carrier. The system provides for automated operation and digital readout that allows use without a trained operator and assures optimum phase and amplitude settings. The present system measures noise to within fractional Hertz of the cattier using a long fiber optic delay line. The present system uses carrier nulling to achieve increased sensitivity (large carrier to noise levels in dBc per Hz bandwidth). The present system uses a waveguide delay line with carrier nulling to measure ultra-low noise sources. The present system also takes advantage of carrier nulling with its increased sensitivity by using the coax delay line, with its greater loss compared a conventionally used waveguide delay line, to make the system more compact and affordable. The present invention achieves this capability by giving up some of the increased sensitivity gained by carrier nulling to achieve results similar to the current conventional large size, heavy and costlier waveguide-based phase noise test system.

The test system provides for a wide bandwidth, automated, lightweight, compact and affordable noise test set capability. A major purpose of the invention is to improve the sensitivity of the current waveguide noise measurement test system. Other major advantages of the present invention are derived from the use carrier nulling to measure lower phase noise; and/or to achieve a wide bandwidth, compact, lightweight, and low cost system using a coax (instead of waveguide) delay line discriminator with carrier nulling to provide a sensitivity comparable to the conventional larger and heavier test system. Also, the use of a fiber optic delay line for wide RF carrier coverage and flexibility in selecting delay line length (for sensitivity flexibility) is included.

The use of carrier nulling (cancellation) and a low noise microwave amplifier in conjunction with different types of delay lines in a delay line discriminator type system provides a for versatile phase noise measurement test system. For best results the RF amplifier used in the system should have especially low RF noise. The delay line can use waveguide, coax, or fiber optic transmission lines. The coax delay line is used to provide equivalent sensitivity with respect to the conventional waveguide-based system, but with smaller size, less weight, less cost, and is readily available. A coax delay line can provide this sensitivity over a very wide RF bandwidth (from below 1 to above 18 GHz), and also provide phase noise measurements for optimization for higher carrier offset frequencies when shorter delays are switched in.

The fiber optic delay line provides a much longer time delay (compared to using waveguide or coax delay line) in a small, compact size and it is primarily used for phase noise measurements at small carrier offset frequencies (from <1 to >1000 Hz). The fiber optic delay line can be expensive, but is also the most versatile. Techniques of switching between fiber optic delay line length, carrier nulling and the use of selected offset frequency regions may also be used to extend the offset frequencies out as far as those obtained with other types of delay lines while optimizing sensitivity. Automatic tuning and calibration is provided for each type of delay line. The universal noise integrated test system also provides an automated GO/NO-GO capability and a displayed noise output for evaluation and fault isolation at the unit under test. The present universal noise integrated tester provides equal or better performance than the best commercial or military available phase noise measurement equipment.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1a is a diagram of a conventional absolute phase noise measurement test system;

FIG. 1b is a diagram of a conventional combined absolute and relative noise measurement test system;

FIG. 3 is a block diagram of the phase noise measurement test system of FIG. 2 showing major modules, or "decks" thereof;

FIG. 4 illustrate the layout of the test system of FIG. 3; and

FIG. 5 shows an embodiment of the system that employs a circulator coupled delay line and carrier nulling with a delay line that is half the typical delay line length.

DETAILED DESCRIPTION

Figure 2:
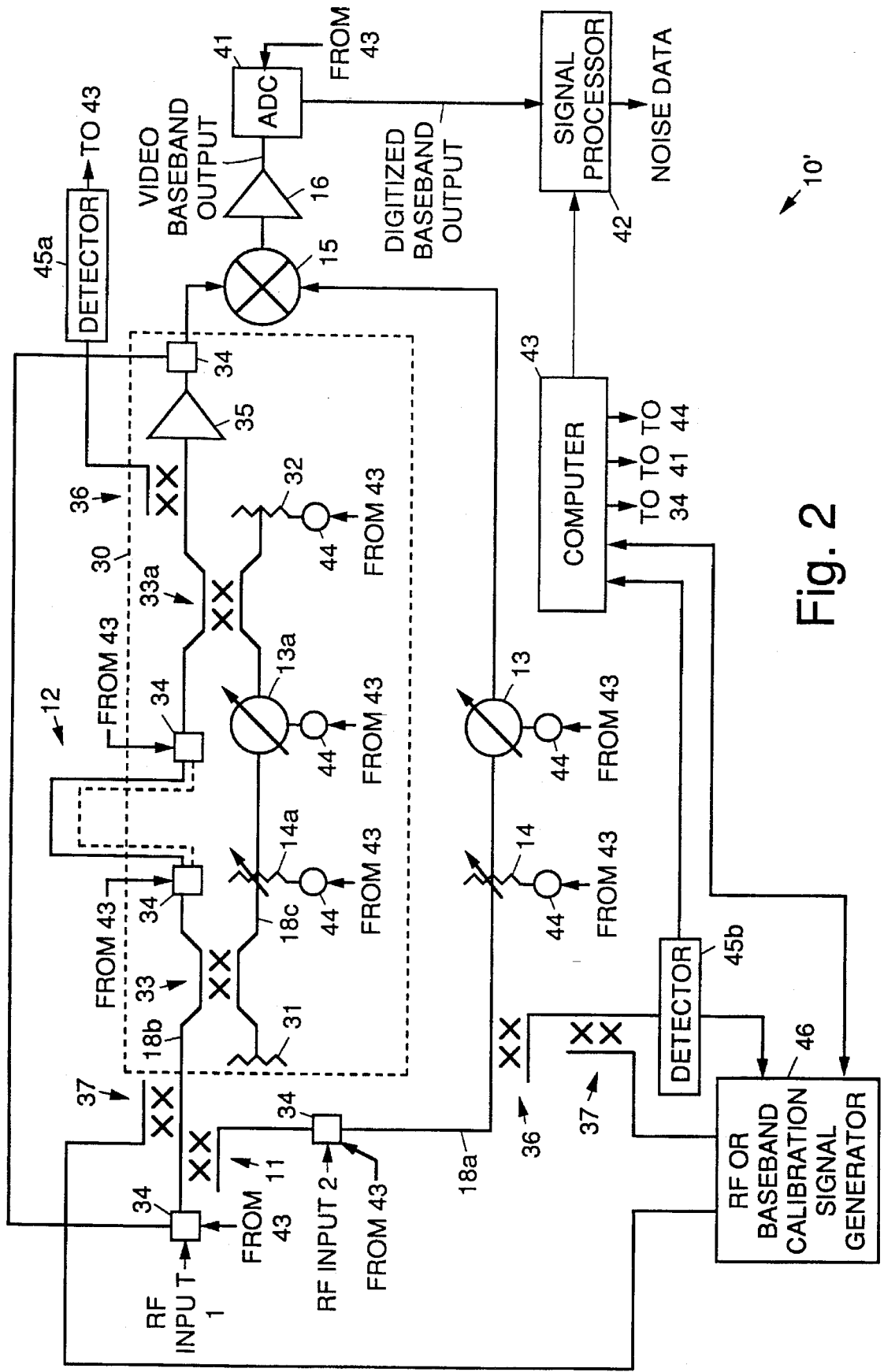
FIG. 2 is a diagram showing a noise measurement test system in accordance with the principles of the present invention that includes carrier nulling components.

Referring to the drawing figures, FIG. 1a is a diagram of a conventional absolute noise measurement test system 10. The test system 10 uses a delay line discriminator 20 to convert short term phase fluctuations of applied RF input signals into baseband video output signals to measure phase noise of an RF signal source. The primary application is for RF sources with relatively low phase noise used in radar, electronic warfare, and communication systems.

The test system 10 takes an RF input signal derived from a continuous wave or pulsed RF source comprising a unit under test (UUT) 40 and splits its output into first and second paths 18a, 18b using an RF coupler 11. The first path 18a is direct (minimum delay) and nondispersive and provides the reference signal input to a synchronous detector 15. The reference input is passed through an adjustable phase shifter 13 and an adjustable attenuator 14 and applied to one input of the synchronous detector 15, which comprises a mixer 15. The second path 18b, or delay path 18b, contains a dispersive network 19, a delay line 12, and provides a second signal input to the synchronous detector 15. The synchronous detector 15 is operated as a phase detector (two inputs in phase quadrature for 90° out-of-phase) and outputs demodulated baseband phase noise. AM measurements may be made using either a simple diode detector that receives the RF signal to be measured via a switch in the RF input. Also, the synchronous detector 15 may be used as an AM detector by adjusting the phase shifter 13 for in-phase instead of quadrature-phase. The operation of this type of noise measurement test system 10 is well-understood by those skilled in the art.

Referring to FIG. 1b, it shows a simplified diagram of a conventional combined absolute and relative noise measurement system 10. The absolute test system 10 was described with reference to FIG. 1a, and only the relative portion of the test system 10 will be described with reference to FIG. 1b. The portion of the test system 10 that provides for relative noise measurement comprises a unit under test (UUT) 40 that receives an RF input signal from the RF signal source. A portion of the RF input signal is coupled off using the coupler 11 to provide a first relative reference signal (REL RF1) that is applied to a first input of a first switch 17a. The output of the unit under test 40 provides a second relative input signal (REL RF2) that has the added noise and is coupled to a first input of a second switch 17b. The output of the second switch 17b is coupled through the adjustable phase shifter 13 and adjustable attenuator 14 and is applied to one input of the synchronous detector 15. The output of the first switch 17a is applied to the second input of the synchronous detector 15. The switches 17a, 17b are operated to switch both relative signals (RF1, RF2) to both inputs of the synchronous detector 15.

The relative test system 10 measures the noise by comparing (in the phase, or the amplitude detector depending on how it is set up, 90° for phase noise measurements or in-phase for AM noise measurements) with the RF input of the unit under test relative to its output (that has the added noise from the unit under test). The measurement technique is the same as that of the absolute noise test system 10 except that the reference signal is available at the input of the unit under test and thus a delay line is not needed to provide the reference signal.

Referring to FIG. 2, it shows a noise measurement test system 10', or universal noise integrated tester 10', in accordance with the principles of the present invention. The system 10' replaces and improves upon the waveguide delay line discriminator noise measurement test system 10 shown in FIG. 1a or 1b currently used by the assignee of the present invention, and other commercially available types of phase noise measurement equipment. The noise measurement test system 10' is operated over an RF carrier spectrum from very low frequencies (in the MHz range) to very high frequencies (in the millimeter wave range). The system 10' measures absolute and relative phase noise of less than 1 Hz to greater than 1 GHz frequency offset from the RF carrier. The system 10' uses carrier nulling to obtain noise measurement sensitivities far exceeding most currently available test systems. The system 10' uses standard off-the-shelf, commercially available, components to provide a compact, automated and affordable system 10'.

FIG. 3 is a block diagram of the phase noise measurement test system 10' showing major modules, or "decks", and FIG. 4 illustrate the layout of the test system 10'. The system 10' includes an RF deck 21 that is coupled by way of a video deck 22 to a digital deck 23. A delay line deck 24 is coupled to the RF deck 21. The RF deck 21 receives RF input signals and delayed signals from the delay line deck 24. A control deck 25 which includes automation circuits 29, a computer (CPU) 26, analog to digital converter (ADC) 28 and disk drive 27 and control functions is coupled to each of the other decks 21–24.

Digital signal processing techniques and a calibration technique are implemented in the digital deck 23 and perform spectral analysis that replaces the conventional man-in-the-loop that manually operates a spectrum analyzer. The disadvantages of using the conventional spectrum analyzer and manual operation is that test execution time is relatively long due to slow sweep times required for selection of narrow resolution bandwidths, and testing is a labor intensive operation. Long sweep times introduce transient noise and measurement parameter drifts. The use of different types and lengths of delay lines 12 in the delay line deck 24 allows for flexibility in optimizing and in the selection of system sensitivity, RF input and relative offset frequency range.

The components of the RF and video decks 21, 22 are shown in FIG. 2. The RF deck 21 contains an RF input and the RF coupler 11 that couples a portion of the applied RF noise signal through the variable attenuator 14 and the variable phase shifter 13 to one input of the mixer 15. An RF carrier nulling circuit 30 comprises the carrier nulling hybrid 33 including an RF load 31 that splits the RF input noise signal a second time after the initial split. One portion of the noise signal is coupled through one or more delay lines 12. The additional delay lines 12 are coupled into and out of the circuit 30 by means of a multiple switch 34. The remainder of the noise signal split by the hybrid 33 is coupled through a second variable attenuator 14a and a second variable phase smiler 13a to a second carrier nulling hybrid 33a with a load 32. The second carrier nulling hybrid 33a combines the undelayed and delayed portions of the noise signal and couples it to a low noise amplifier 35. A second RF coupler 36 is provided to couple off a null monitor signal. The output of the low noise amplifier 35 is coupled to a second input of the mixer 15. The output of the mixer 15 is a video signal that is coupled through a video amplifier 16 to provide the baseband video output signal.

The carrier nulling circuit 30 implements a technique that is generally described in the literature. The carrier nulling circuit 30 cancels some of the continuous wave carrier signal of the RF input signal, and this allows the low noise amplifier 35 to increase the phase noise amplitude and thus the sensitivity of the system 10'. The nulling is needed to keep the high level carrier signal from saturating the low noise amplifier 35. The low noise amplifier 35 is selected to have low RF noise since this type of noise also limits system sensitivity. The cartier nulling circuit 30 couples off at coupler 36 some of the carrier signal and provides adjustments for phase and amplitude control (the second variable attenuator 14a and second variable phase shifter 13a) so that the coupled off signal may be added back with the main carrier signal out-of-phase to cancel a portion of the carrier signal and only a small amount of the noise. Only a small amount of noise to be measured is canceled because the bypassed (or nondelayed) carrier noise is uncorrelated with the delayed noise, by virtue of the noise decorrelation in the delayed path. Because the carrier nulling circuit 30 increases the sensitivity system 10, and because not all of this increased sensitivity is required for most measurements, a coaxial delay line 12 is employed that has more loss (less sensitivity) than other conventionally used delay lines, but provides for a flexible, smaller, more compact, wide frequency range delay line 12, as compared to a waveguide delay line.

Also shown in FIG. 2 are circuits and components used to provide a calibration signal used in determining relative carrier-to-noise ratio which is the desired output of a unit under test 40 that is measured. In addition, an analog-to-digital converter (ADC) 41, signal processor 42 and control computer 43 are shown. The ADC 41 is used to digitize the video baseband output signal so it can be processed in the signal processor 42 to obtain the carrier-to-noise level versus relative frequency noise data. The computer 43 also sends control signals to servos 44 that adaptively control all adjustable elements (phase shifters 13 and attenuators 14), to switches 34 for switching in circuits (i.e., delay lines 12, etc.), and receives feedback signals from detectors 45a, 45b (RF diode detectors) via RF couplers 36 to set levels and make adjustments to phase and attenuator settings to obtain initial and optimum settings to provide maximum measurement sensitivity and calibration. The diode detector 45a may also be used to directly measure AM noise. A calibration signal generator 46 is used to input an RF or baseband calibration signal into the system 10' via RF couplers 37, as shown.

The video deck 22 contains the baseband circuits employed in the system 10, including the video amplifier 16, a correlation circuit and a baseband analog calibration input. These components are well understood and are generally described in U.S. Pat. No. 4,918,373 with reference to FIG. 5 thereof, and the articles entitled "Extending the Range and Accuracy of Phase Noise Measurements" and "Cross-Correlation Phase Noise Measurements", for example, referenced in the Background section. The automated control deck 29 has the circuits that automatically adjust any of the functions that are normally done manually, such as phase shifter 13 and attenuator 14 adjustments, and the like. The automated part of the system 10' comprises a control function and a signal processing function. The control function is implemented in the computer 43 and sends commands and receives feedback from all of the components of the system 10' that are adjustable such as attenuators 14, phase shifters 13 and switches 34, and the like. The attenuators 14 and phase shifters 13 are used to set levels and phase for such functions as establishing in-phase and quadrature (90° phase) for the phase detector carrier nulling and RF calibration. These control signals control the servos 44, and feedback signals from monitor points provided by the detectors 45a, 45b. The monitor points may be from the video output or RF detectors that sample RF levels. The video signals are digitized using the analog to digital converter 41 and feedback signals to the computer 43.

The signal processor 42 takes the digitized (using the ADC 41) output of the video amplifier 16 and uses a discrete Fourier transform that provides a faithfully accurate noise spectrum that is compared with the calibration signal. This is generally described in the article entitled "Using Digital Data Processing to Speed Up Radar Phase Noise Measurements" referenced in the Background section. The automated feature is one that is important in saving time in making measurements and minimizes the training of operators. Usually, the adjustments that are needed to make noise measurements require considerable operator training and sometimes continual adjustments because of drift.

FIG. 5 shows a delay line embodiment of the present system 10' that employs a circulator coupled delay line 12 and carrier nulling wherein the delay line 12 that is half the typical delay line length. A circulator 51 is provided in the delay path 18b. An RF tuner 52 is coupled between the circulator 51 and the delay line 12, which is coupled to and RF adjustable short 53. The purpose of the RF tuner 52 and the adjustable shout 53 is to adjust the delay line 12 for the correct length (short 53) and obtain good RF match (tuner 52) to cancel the carrier. Since phase is modulo $2\pi$ (repeats) only 360 degrees of phase adjustment is required. With regard to the embodiment of FIG. 5, the addition of the short 53 and the circulator 51 cuts down on the length of the delay line 12 (making for a more compact system 10') and reduces the signal loss. The signal loss is caused by the hybrid coupler 33 shown in FIG. 4 that supplies the signal to the carrier nulling circuit 30, and the length of the delay line 12 is cut in half by using the short 53 to reflect the signal back through the delay line 12.

The use of correlation techniques described in the literature is a way to separate the phase noise due to a device under test from noise in the low noise amplifier 35 in the carrier nulling circuit 30, the mixer 15 and the video amplifier 16. The correlation technique requires additional circuits but may be implemented using digital processing techniques. The correlation technique is only utilized when the highest system sensitivity is required. The cross-correlation technique is where the output of the delay line and the reference channel are split and each phase detected in separate circuits. The two video outputs are then processed via cross correlation analyzer techniques. These techniques are described in the literature, such as in "Cross-Correlation Phase Noise Measurements", for example, cited in the Background section.

Finally, the use of a fiber optic delay line 12 provides the flexibility and capability to achieve very long delays for noise measurements at frequencies close to the carrier, and short delays for frequencies far from the carrier. This allows the length of the delay line 12 to be selected to optimize the sensitivity of the system 10' for noise measurements. The use of the fiber optic delay line 12 also produces a small and compact system 10'. In addition, a mirror (in place of the short 53), an optical circulator 51, and adjustable fiber optic delay line 12 may be implemented in a manner similar to that described for the RF delay line 12 shown in FIG. 5, achieving carrier nulling and also cutting the length of the delay line 12 in half.

Because of the relationship at the delay length and the relative noise to be measured, delays can be selected that have the noise at a given frequency come in at any phase relative to the undelayed noise. Thus a delay of 10 microseconds will have noise at 100,000 Hertz ($1/10^{-5}$ Hz) be in phase (or add) to the non-delayed signal. Thus, a 6 dB increase in noise at that (and nearby frequencies) can be obtained. Typically advantage of this increase in noise is not take because delay lengths are usually fixed and pick so calibration is a linear function; usually going at 6 dB per octave change in frequency. Since the system is computer controlled, calibration data that is not a straight line, linear function i.e., in the $\sin(x)/x$ portion of the discrimination output equation, the fiber optic delay line can be utilized to maximize noise measurement flexibility to achieve optimum sensitivity and frequency range of noise measurement relative to the carrier. But in a fiber optic delay line 12, lengths of delay are relatively easy to change and long or short delays can be obtained, thus noise at those frequencies (where the delay is such that the delayed and non-delayed noise are in phase) will be larger by 6 dB and thus an increase sensitivity is achieved. Also, the frequencies where this occurs repeats at multiples of one over the delay length. Thus by choosing different delay lengths for the desired frequency of relative noise (relative to carrier) is to be measured, an increased sensitivity can be obtained. This feature is typically not done with either coax or waveguide delay line systems because they are not as flexible in their ability to package and change delay line lengths.

The delay line noise measurement test system 10' provides spur-free operation compared to the two-oscillator technique. The present delay line noise measurement test system 10' uses coax and fiber optic delay lines 12 that allow RF coverage over many octaves of carrier bandwidth and measures relative offset frequencies close into and far out from the RF carrier. The delay line noise measurement test system 10' provides for relative (where an input reference signal is available, i.e., RF amplifiers) and absolute (where no input reference signal is available, i.e., RF signal generators) noise measurements. The present delay line noise measurement test system 10' may be used with continuous wave and pulsed RF operation. Also any of the described additional functions (extra delay line types, noise correlation, etc.) may be included as desired because of the modular and computer controlled design of the system 10'.

Several other items may be incorporated into the system 10' to improve performance. One is the use of a battery operation option and fluorescent light shielding to avoid noise problems from the power supply, especially 60 Hz lines. Another is packaging to include temperature control to minimize phase drift and acoustic noise suppression to minimize acoustically induced delay line noise in the delay line section. Also, the use of a very high frequency (VHF) power supply for light weight, compact size and low ripple operation.

Thus, a noise measurement test system for making phase noise and amplitude noise measurements of microwave signals has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A noise measurement test system 10' for making phase noise and amplitude noise measurements of microwave signals derived from an RF source 40, said system 10' comprising:

an RF input for receiving an applied RF noise signal from the RF source 40;

an RF coupler 11 coupled to the RF input for splitting the applied RF noise signal into first, second, and third paths 18a, 18b, . . . 18c;

a mixer 15 that comprises a synchronous phase detector 15 having first and second inputs coupled to receive signals form the first and second paths 18a, 18b, respectively, and which outputs demodulated phase noise;

and wherein the first path 18a comprises a variable attenuator 14 and a variable phase shifter 13 coupled between the coupler 11 and the first input to the mixer 15 for providing a reference signal input to the synchronous detector 15;

and wherein the second path 18b comprises a delay line 12, a low noise amplifier 35, wherein an output of the low noise amplifier 35 is coupled to the second input to the mixer 15, and an adjustable RF carrier nulling circuit 30, said RF carrier nulling circuit 30 comprising a first carrier nulling hybrid 33 for splitting a portion of the RF input noise signal coupled to the second path 18b into the third path 18c, coupled between the coupler 11 and the second input of the mixer 15;

and wherein the third path 18c comprises a second variable attenuator 14a, a second variable phase shifter 13a, and a second carrier nulling hybrid 33a; and a video amplifier 16 coupled to an output of the mixer 15 for providing a baseband video output signal from the system 10'.

2. The system 10' of claim 1 wherein the second path comprises a plurality of delay lines 12 that are selectively coupled into the second path by means of a switch 34.

3. The system 10' of claim 1 wherein the delay line 12 comprises a circulator coupled delay line 12 and carrier nulling circuit 30.

4. The system 10' of claim 1 wherein the delay line 12 comprises a circulator 51 disposed in the second path 18b;

an RF tuner 52 coupled to the circulator 41;

a delay line 12 coupled to the RF tuner 52; and an RF adjustable short 53 coupled to the delay line.

5. The system 10' of claim 1 wherein the delay line 12 comprises a fiber optic delay line 12.

6. The system 10' of claim 5 wherein the fiber optic delay line 12 comprises a circulator 41 disposed in the second path 18b;

a fiber optic delay line 12 coupled to circulator 41; and a mirror 53 coupled to the fiber optic delay line 12.

7. The system 10' of claim 1 further comprising:

a first switch 17a disposed to receive the applied RF noise signal comprising a first reference RF signal at a first input and the applied RF noise signal at a second input, and for selectively outputting either the first reference RF signal or the delayed version of the applied RF noise signal to the first input of the mixer 15;

a unit under test disposed in the first path for receiving the applied RF signal and for outputting a second relative RF noise signal; and a second switch 17b having a first input coupled to the unit under test for receiving the second RF noise signal and a second input coupled to receive the applied RF noise signal, and for selectively outputting either the second relative RF signal or the applied RF noise signal through the variable attenuator 14 and variable phase shifter 13 to the second input of the mixer 15.

8. The system 10' of claim 1 wherein the adjustable RF carrier nulling circuit is used with a coaxial delay line to allow sensitive noise measurements to be made.

9. The system 10' of claim 1 which further comprises an analog-to-digital converter 28 and a digital processor coupled to the output of the video amplifier 16 to output noise and data.

10. The system 10' of claim 1 which further comprises control means coupled to the variable attenuator 14 and variable phase shifter 13 for automatically controlling the settings thereof.

11. The system 10' of claim 1 which further comprises an adaptive computer control system coupled to the variable attenuator 14 and variable phase shifter 13 for adaptively controlling the settings thereof to provide optimum settings.

12. The system 10' of claim 6 wherein the fiber optic delay line 12 has switchable line lengths that are selected to optimize the measurement sensitivity of the system 10'.

* * * * *